(12) United States Patent
Onishi et al.

(10) Patent No.: US 10,319,831 B2
(45) Date of Patent: Jun. 11, 2019

(54) SEMICONDUCTOR DEVICE WITH A GATE ELECTRODE POSITIONED IN A SEMICONDUCTOR SUBSTRATE

(71) Applicant: TOYOTA JIDOSHA KABUSHIKI KAISHA, Toyota-shi, Aichi-ken (JP)

(72) Inventors: Toru Onishi, Nagoya (JP); Shuhei Oki, Nagakute (JP); Tomoharu Ikeda, Nissin (JP); Rahman Md. Tasbir, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/300,848

(22) PCT Filed: Feb. 25, 2015

(86) PCT No.: PCT/JP2015/055408
§ 371 (c)(1),
(2) Date: Sep. 30, 2016

(87) PCT Pub. No.: WO2015/162990
PCT Pub. Date: Oct. 29, 2015

(65) Prior Publication Data
US 2017/0033195 A1 Feb. 2, 2017

(30) Foreign Application Priority Data
Apr. 25, 2014 (JP) ................ 2014-091422

(51) Int. Cl.
*H01L 21/28* (2006.01)
*H01L 29/10* (2006.01)
(Continued)

(52) U.S. Cl.
CPC .... *H01L 29/66348* (2013.01); *H01L 21/2253* (2013.01); *H01L 21/28035* (2013.01);
(Continued)

(58) Field of Classification Search
CPC .......... H01L 29/4236; H01L 29/66348; H01L 29/66734; H01L 29/7813; H01L 21/28114
See application file for complete search history.

(56) References Cited

U.S. PATENT DOCUMENTS 6,312,993 B1 * 11/2001 Hshieh ................ H01L 29/7813
438/270
6,525,373 B1 * 2/2003 Kim ..................... H01L 29/7813
257/330
(Continued)

FOREIGN PATENT DOCUMENTS

CN 101295674 A 10/2008
CN 102197487 A 9/2011
(Continued)

OTHER PUBLICATIONS

English Translation of Japenese Patent Document JP 2012/174852 A provided by AIPN, Sep. 10, 2012.*

Primary Examiner — Stephen M Bradley
(74) Attorney, Agent, or Firm — Oliff PLC

(57) ABSTRACT

Technique disclosed herein can suppress performance variation among semiconductor devices to be manufactured upon manufacturing each semiconductor device by forming diffusion layer by ion implantation to semiconductor substrate after etching. A semiconductor device includes a semiconductor substrate. The semiconductor substrate includes an emitter region, a top body region, a barrier region, a bottom body region, a drift region, a collector region, a trench, a gate insulating film, and a gate electrode. A front surface of the gate electrode is provided at a deeper position than a front surface of the semiconductor substrate. Within the gate electrode, a front surface of a first portion at a widthwise center of a trench is provided at a shallower position than a front surface of a second portion in contact with the gate insulating film.

5 Claims, 11 Drawing Sheets

(51) Int. Cl.
  *H01L 29/16* (2006.01)
  *H01L 29/66* (2006.01)
  *H01L 29/78* (2006.01)
  *H01L 21/225* (2006.01)
  *H01L 29/423* (2006.01)
  *H01L 29/739* (2006.01)

(52) U.S. Cl.
  CPC .... *H01L 21/28114* (2013.01); *H01L 29/1095* (2013.01); *H01L 29/4236* (2013.01); *H01L 29/42376* (2013.01); *H01L 29/739* (2013.01); *H01L 29/7397* (2013.01); *H01L 29/1608* (2013.01); *H01L 29/66734* (2013.01); *H01L 29/7813* (2013.01)

(56) References Cited

U.S. PATENT DOCUMENTS

| | | | | |
|---|---|---|---|---|
| 2002/0155665 | A1* | 10/2002 | Doris | H01L 21/2807 438/279 |
| 2003/0227050 | A1* | 12/2003 | Yoshimochi | H01L 29/7813 257/330 |
| 2009/0140330 | A1* | 6/2009 | Yagi | H01L 21/76202 257/330 |
| 2011/0201187 | A1* | 8/2011 | Nishiwaki | H01L 29/0834 438/529 |
| 2012/0049202 | A1* | 3/2012 | Nakano | H01L 29/7813 257/77 |
| 2012/0146091 | A1 | 6/2012 | Tanabe et al. | |
| 2013/0026536 | A1 | 1/2013 | Corona et al. | |

FOREIGN PATENT DOCUMENTS

| | | | |
|---|---|---|---|
| JP | 2001-244328 | A | 9/2001 |
| JP | 2010-056432 | A | 3/2010 |
| JP | 2010-62258 | A | 3/2010 |
| JP | 2010-103326 | A | 5/2010 |
| JP | 2010-147298 | A | 7/2010 |
| JP | 2012-138567 | A | 7/2012 |
| JP | 2012-174852 | A | 9/2012 |
| JP | 2012174852 | A * | 9/2012 |
| JP | 2015-126027 | A | 7/2015 |
| WO | 2010/119789 | A1 | 10/2010 |

* cited by examiner

SEMICONDUCTOR DEVICE WITH A GATE ELECTRODE POSITIONED IN A SEMICONDUCTOR SUBSTRATE

TECHNICAL FIELD

This application claims priority to Japanese Patent Application No. 2014-091422. filed on Apr. 25, 2014, the entire contents of which are hereby incorporated by reference into the present application.

The art disclosed herein relates to a semiconductor device manufacturing method and a semiconductor device.

BACKGROUND ART

Japanese Patent Application Publication No. 2001-244328 discloses a technique that disposes a first fill material on a semiconductor substrate that includes a trench, disposes a second fill material having a higher etching resistance than the first fill material on the first fill material, and thereafter etches back the second fill material and the first fill material.

SUMMARY

Technical Problem

There is a known technique that performs an ion implantation on a semiconductor substrate after having formed a trench filled, with a fill material. When the ion implantation is to be performed on the semiconductor substrate having a trench, it is difficult to accurately control ion implantation depths. Due to this, impurity densities in vicinities of trenches vary among the semiconductor devices to be manufactured, and there is a problem that a variation in performance (that is, thresholds) becomes large among the semiconductor devices.

Solution to Technical Problem

A manufacturing method of a semiconductor device disclosed herein, the method comprising: forming a trench in a front surface of a semiconductor substrate; forming a gate insulating film covering an inner surface of the trench; depositing a first fill material on a side surface of the gate insulating film in the trench; depositing a second fill material having a higher etching resistance than the first fill material on a side surface of the first fill material in the trench; removing a part of the first fill material in the trench and a part of the second fill material in the trench by etching from a front surface side of the semiconductor substrate so as to position a front surface of the second fill material in the trench at a shallower position than a front surface of the first fill material in the trench; and forming a diffusion layer after the etching by an ion implantation to the semiconductor substrate from the front surface side of the semiconductor substrate.

In the above method, the second fill material in the trench has a higher etching resistance than the first fill material. Due to this, upon etching, an, etching speed becomes slower for the fill material at a center in a width direction of the trench (that is, the second fill material) than for the fill material making contact with a side surface of the trench (that is, the first fill material). As a result, the front surface of the second fill material in the trench comes to be positioned at the shallower position than the front surface of the first fill material in the trench. Accordingly, when the etching speed is slower for the fill material at the center in the width direction of the trench, an etching accuracy is improved, and post-etch shapes of the first fill material and the second fill material become stabilized. Due to this, depths of the ion implantations taking place thereafter can be controlled accurately. As a result, a variation in impurity densities in vicinities of trenches among the semiconductor devices to be manufactured can be suppressed, and a variation in performance (that is, thresholds) among the semiconductor devices can be suppressed.

A semiconductor device disclosed herein comprises: a semiconductor substrate; a trench provided in a front surface of the semiconductor substrate; a gate insulating film covering an inner surface of the trench; and a gate electrode provided on an inner side of the gate insulating film. A front surface of the gate electrode is provided at a position deeper than the front surface of the semiconductor substrate, and a front surface of a first part of the gate electrode, which is located at a center in a width direction of the trench, is provided at a position shallower than a surface of a second part of the gate electrode which is in contact with the gate insulating film.

DESCRIPTION OF EMBODIMENTS

Figure 1:
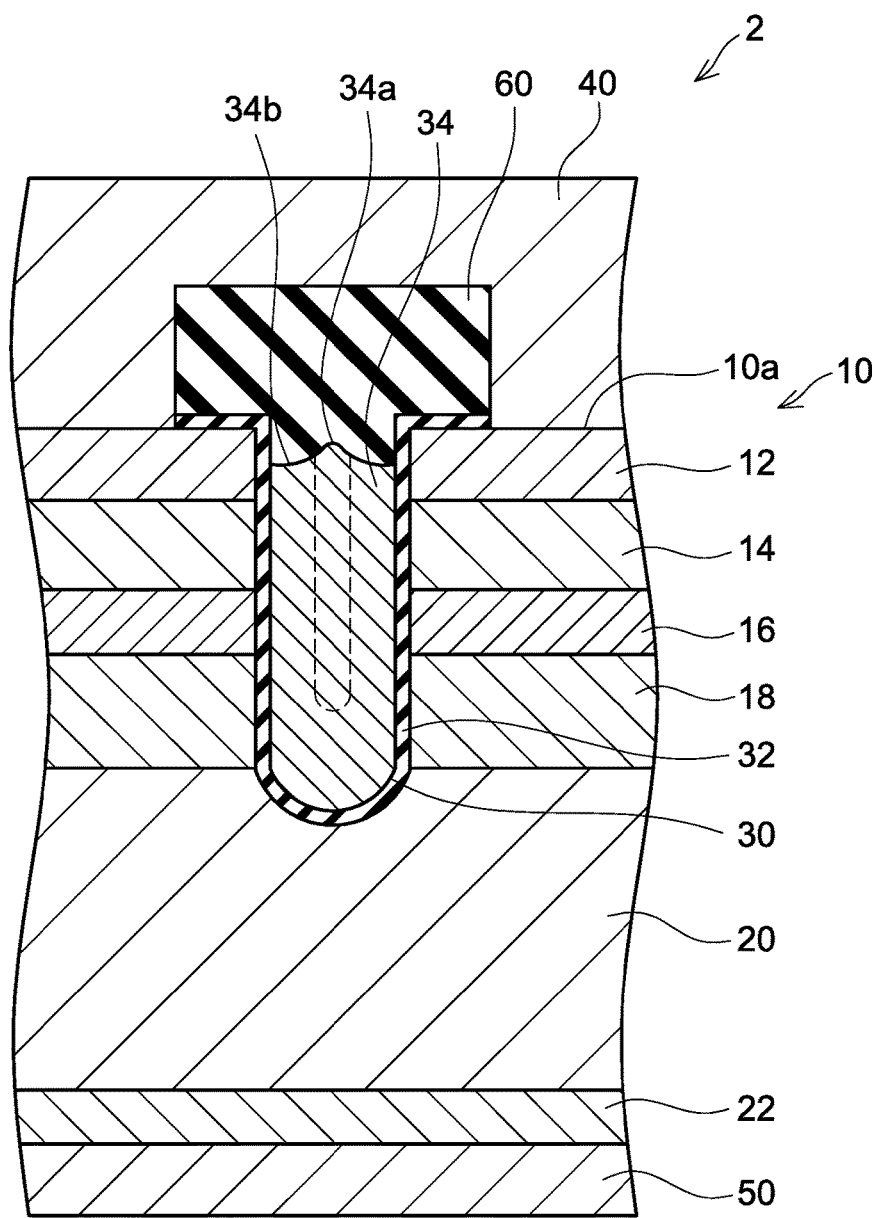
FIG. 1 is a cross sectional view schematically showing a semiconductor device of an embodiment.

Some features of embodiments described hereinbelow will be listed. Notably, each of the below features is independently useful.

(Feature 1) The first fill material may be polysilicon. The second fill material may be polysilicon. The first fill material may contain a higher density of phosphorous than the second fill material.

(Feature 2) in a width direction of the trench, a total widthwise thickness of the first fill material positioned on both sides of the second fill material may be larger than a widthwise thickness of the second till material. According to this method, phosphorus in the first fill material can sufficiently be diffused into the second fill material by performing a heat treatment that is to take place later. Due to this, a gate electrode having a suitable conductivity can be produced from the first fill material and the second fill material.

(Feature 3) The etching may be performed such that a part of the front surface of the first fill material which is in contact with the gate insulating film is located at a depth within 400 nm from the front surface of the semiconductor substrate. According to this method, an ion implantation depth can be prevented from becoming locally deep in a vicinity of the trench.

(Feature 4) The semiconductor substrate may be a semiconductor substrate of a firstconductivity type. The forming of the diffusion layer may comprise: forming a front surface semiconductor region of the first conductivity type which is exposed on the front surface of the semiconductor substrate by an ion implantation of first conductivity type impurities to the semiconductor substrate from the front surface side of the semiconductor substrate; forming a top body region of a second conductivity type at a position deeper than the front surface semiconductor region by an ion implantation of second conductivity type impurities to the semiconductor substrate from the front surface side of the semiconductor substrate; and forming a barrier region of the first conductivity type at a position deeper than the top body region by an ion implantation of first conductivity type impurities to the semiconductor substrate from the front surface side of the semiconductor substrate, the barrier region having an increased first conductivity impurity density than before the ion implantation, and the front surface semiconductor region, the top body region, and the barrier region are formed adjacent to a part of the gate insulating film which is formed on a side surface of the trench.

(Feature 5) The forming the diffusion layer may further comprise: forming a bottom body region of the second conductivity type at a position deeper than the barrier region by an ion implantation of second conductivity type impurities to the semiconductor substrate from the front surface side of the semiconductor substrate. The bottom body region may be formed adjacent to the part of the gate insulating film which is formed on the side surface of the trench. As above, according to the manufacturing method disclosed herein, the front surface of the second fill material in the trench is positioned at the shallower position than the front surface of the first fill material in the trench. Due to this, the depth of the ion implantation that is to take place later can be controlled accurately, and an occurrence of a situation in which a top body region and a bottom body region warp toward a rear surface direction of the semiconductor substrate in the vicinity of the trench, resulting in disappearance of a barrier region to be formed between the top body region and the bottom body region can be suppressed.

(Feature 6) The front surface of the second part may be provided at a depth within 400 nm from the front surface of the semiconductor substrate.

(Feature 7) The semiconductor device disclosed herein may further comprise: a front surface semiconductor region of a first conductivity type exposed on the front surface of the semiconductor substrate; a top body region of a second conductivity type provided at a position deeper than the front surface semiconductor region; a barrier region of the first conductivity type provided at a position deeper than the top body region; and a drift region of the first conductivity type having a lower first conductivity type impurity density than the barrier region, and provided at a position deeper than the barrier region. The trench may penetrate the front surface semiconductor region, the top body region, and the barrier region. A lower end of the trench may project into the drift region.

(Feature 8) The semiconductor device disclosed herein may further comprise a bottom body region provided at a position deeper than the barrier region and shallower than the drift region. The trench may further penetrate the bottom body region.

(Embodiments)

(Configuration of Semiconductor Device 2)

As shown in FIG. 1, a semiconductor device 2 of the present embodiment is an IGBT (abbreviation of Insulated Gate Bipolar Transistor). The semiconductor device 2 comprises a semiconductor substrate 10 constituted primarily of Si. An interlayer insulating film 60 and a front surface electrode 40 are provided on a front surface 10a of the semiconductor substrate 10, and a rear surface electrode 50 is provided on a rear surface of the semiconductor substrate 10.

The semiconductor substrate 10 comprises an emitter region 12, a top body region 14, a barrier region 16, a bottom body region 18 a drift region 20, a collector region 22, a trench 30, a gate insulating film 32, and a gate electrode 34.

The emitter region 12 is an n-type semiconductor region. The emitter region 12 is provided in a range exposed on the front surface 10a of the semiconductor substrate 10. The emitter region 12 is provided in a range making contact with the gate insulating film 32 in the trench 30. An n-type impurity density of the emitter region 12 is higher than an n-type impurity density of the drift region 20. In the present embodiment, it is $6 \times 10^{19}$ atom/cm$^3$ or greater but $7 \times 10^{19}$ atom/cm$^3$ or less. Here, the term "impurity density" refers to a peak density of impurities in a relevant region. The emitter region 12 makes an ohmic contact with the front surface electrode 40.

The top body region 14 is a p-type semiconductor region. The top body region 14 is provided at a deeper position than the emitter region 12. A junction interface of the emitter region 12 and the top body region 14 is located at a depth of 0.6 μm from the front surface 10a of the semiconductor substrate 10. The top body region 14 makes contact with the gate insulating film 32 in the trench 30. In the present embodiment, a p-type impurity density of the top body region 14 is $1 \times 10^{17}$ atom/cm$^3$ or greater but $2 \times 10^{17}$ atom/cm$^3$ or less. A part of the top body region 14 is exposed on the front surface 10a of the semiconductor substrate 10 in a range that is not shown, and makes an ohmic contact with the front surface electrode 40.

The barrier region 16 is an n-type semiconductor region. The barrier region 16 is provided at a deeper position than the top body region 14. The barrier region 16 is separated from the emitter region 12 by the top body region 14. A junction interface of the top body region 14 and the barrier region 16 is located at a depth of 1.7 μm from the front surface 10a of the semiconductor substrate 10. The barrier region 16 makes contact with the gate insulating film 32 in the trench 30. In the present embodiment, a n-type impurity density of the barrier region 16 is $1 \times 10^{16}$ atom/cm$^3$ or greater but $2 \times 10^{16}$ atom/cm$^3$ or less.

The bottom body region 18 is a p-type semiconductor region. The bottom body region 18 is provided at a deeper position than the barrier region. 16. The bottom body region 18 is separated from the top body region 14 by the barrier region 16. A junction interface of the barrier region 16 and the bottom body region 18 is located at a depth of 2.0 μm from the front surface 10a of the semiconductor substrate 10. The bottom body region 18 makes contact with the gate insulating film 32 in the trench 30. In the present embodiment, a p-type impurity density of the bottom body region 18 is $3 \times 10^{16}$ atom/cm$^3$ or greater but $4 \times 10^{16}$ atom/cm$^3$ or less.

The drift region 20 is an n-type semiconductor region. The drift region 20 is provided at a deeper position than the bottom body region 18. The drift region 20 is separated from the barrier region 16 by the bottom body region 18. A junction interface of the bottom body region 18 and the drift region 20 is located at a depth of 3.5 μm from the front surface 10a of the semiconductor substrate 10. An n-type impurity density of the drift region 20 is lower than the n-type impurity density of the barrier region 18. In the present embodiment, the n-type impurity density of the drift region 20 is $1 \times 10^{13}$ atom/cm$^3$ or greater but $1 \times 10^{14}$ atom/cm$^3$ or less.

The collector region 22 is a p-type semiconductor region. The collector region 22 is provided at a deeper position than the drift region 20. The collector region 22 is provided in a range exposed on the rear surface of the semiconductor substrate 10. The collector region 22 makes an ohmic contact with the rear surface electrode 50.

The trench 30 is provided in the front surface 10a of the semiconductor substrate 10. The trench 30 penetrates the emitter region 12, the top body region 14, the barrier region 16, and the bottom body region 18 from the front surface 10a of the semiconductor substrate 10. A lower end of the trench 30 projects into the drift region 20. The gate electrode 34 covered by the gate insulating film 32 is provided inside the trench 30. A part of the gate insulating film 32 is provided also on the front surface 10a of the semiconductor substrate 10.

The gate electrode 34 is a polysilicon electrode containing phosphorus. A front surface of the gate electrode 34 is provided at a deeper position than the front surface 10a of the semiconductor substrate 10. Further, a front surface of a first portion 34a of the gate electrode 34 at a center in a width direction of the trench 30 is provided at a shallower position (that is, closer to the front surface 10a of the semiconductor substrate 10) than a front surface of a second portion 34b of the gate electrode 34 making contact with the gate insulating film 32. That is, the front surface of the first portion 34a projects upward than the front surface of the second portion 34b. Further, the front surface of the second portion 34b is provided at a depth within 400 nm from the front surface 10a of the semiconductor substrate 10 (that is, at a position that is equal to or shallower than 400 nm from the front surface 10a of the semiconductor substrate 10). The front surface of the gate electrode 34 is covered by the interlayer insulating film 60. The gate electrode 34 is electrically insulated from the front surface electrode 40 by the interlayer insulating film 60. However, the gate electrode 34 can be electrically connected to external components at a position not shown.

(Manufacturing Method of Semiconductor Device 2)

Figure 2:
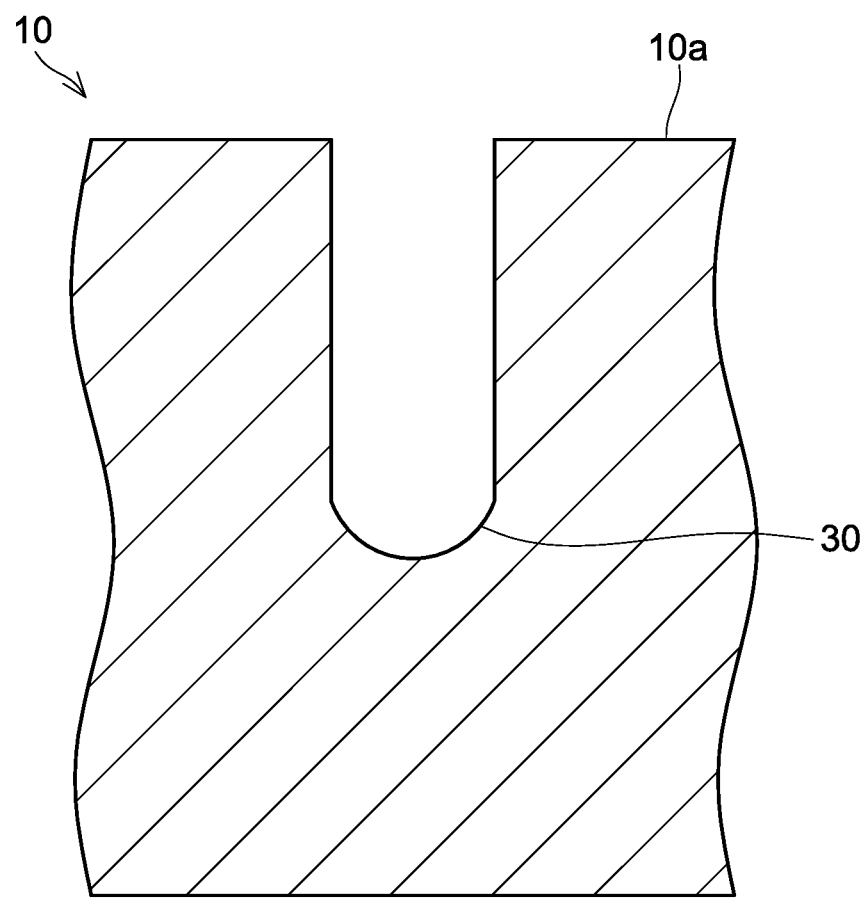
FIG. 2 is a cross sectional view (1) schematically showing a semiconductor device manufacturing method of the embodiment.

Next, a manufacturing method of the semiconductor device 2 of the present embodiment will be described. Firstly, as shown in FIG. 2, the trench 30 is funned in the front surface 10a of the semiconductor substrate 10 constituted of n-type Si. The trench 30 is formed by anisotropic etching or the like.

Figure 3:
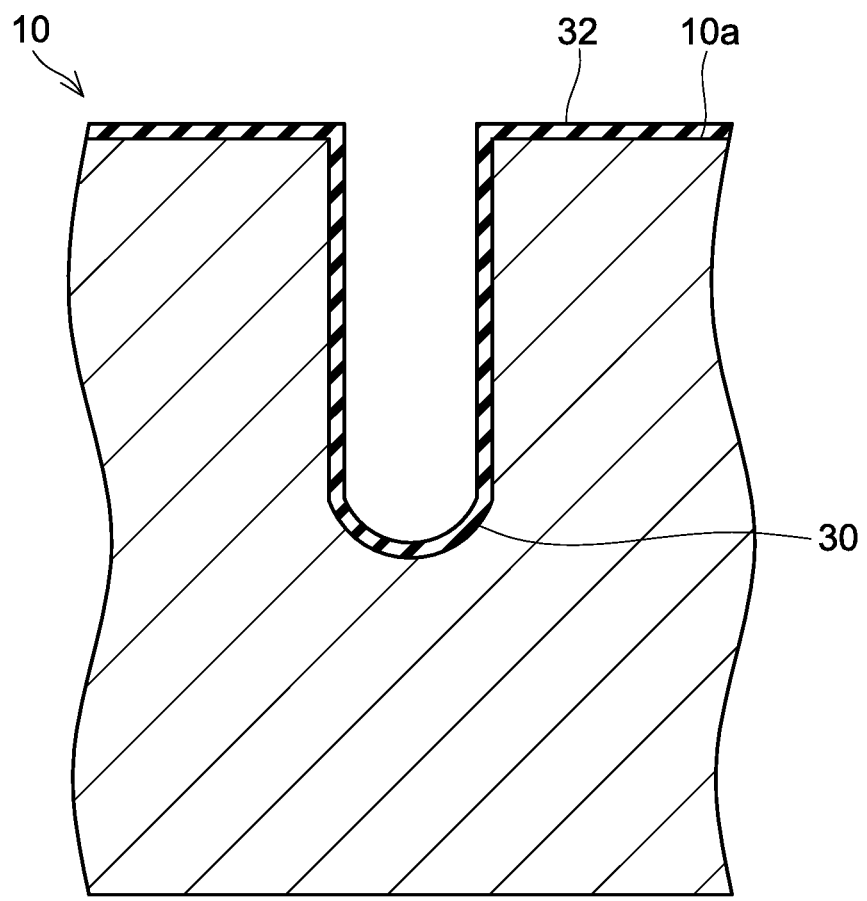
FIG. 3 is a cross sectional view (2) schematically showing the semiconductor device manufacturing method of the embodiment.

Then, as shown in FIG. 3, the gate insulating film 32 is formed on an inner surface of the trench 30 and on the front surface 10a of the semiconductor substrate 10. The gate insulating film 32 is formed by thermal oxidation.

Figure 4:
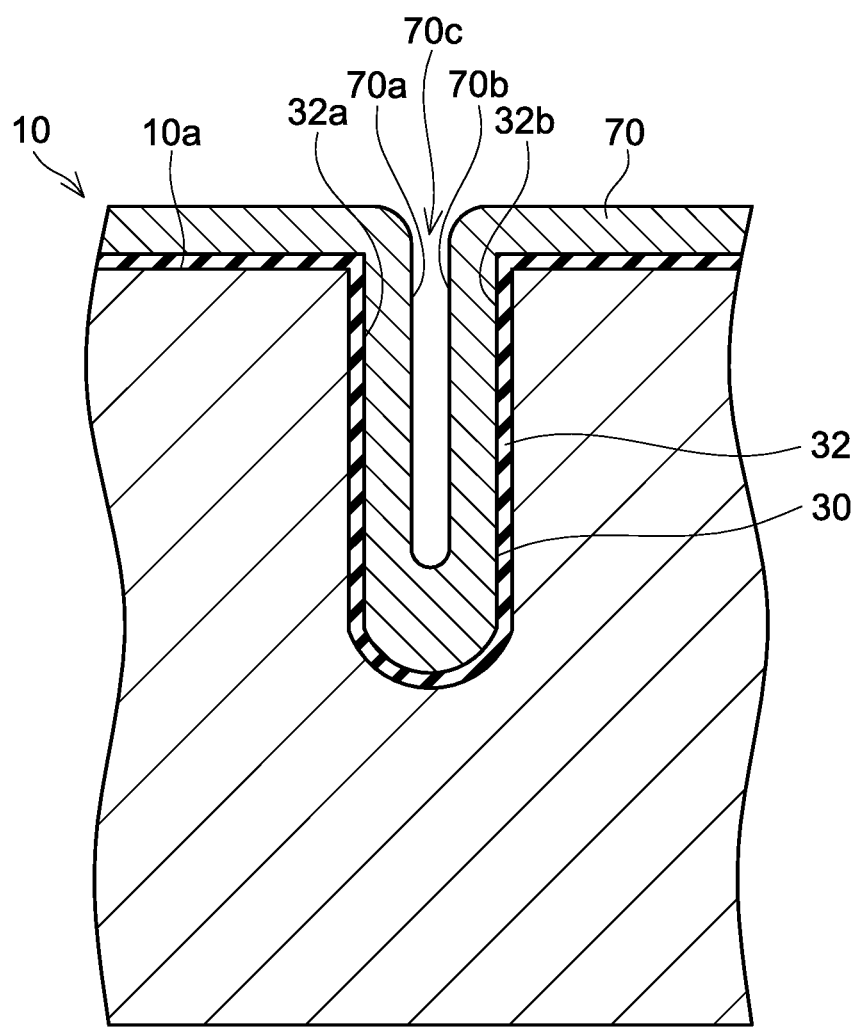
FIG. 4 is a cross sectional view (3) schematically showing the semiconductor device manufacturing method of the embodiment.

Next, as shown in FIG. 4, a first layer 70 constituted of polysilicon containing phosphorus is deposited on a front surface of the gate insulating film 32 in the trench 30 and on a front surface of the gate insulating film 32 on a front surface 10a side of the semiconductor substrate 10. In the trench 30, the first layer 70 grows from side surfaces 32a, 32b of the gate insulating film 32 and from a bottom surface of the gate insulating film 32. Here, the first layer 70 is formed so that an inside of the trench 30 is not fully filled by the first layer 70. That is, the first layer 70 is formed so that a clearance 70c is formed between a side surface 70a and a side surface 70b of the first layer 70. The first layer 70 is formed by CVD (Chemical Vapor Deposition).

Figure 5:
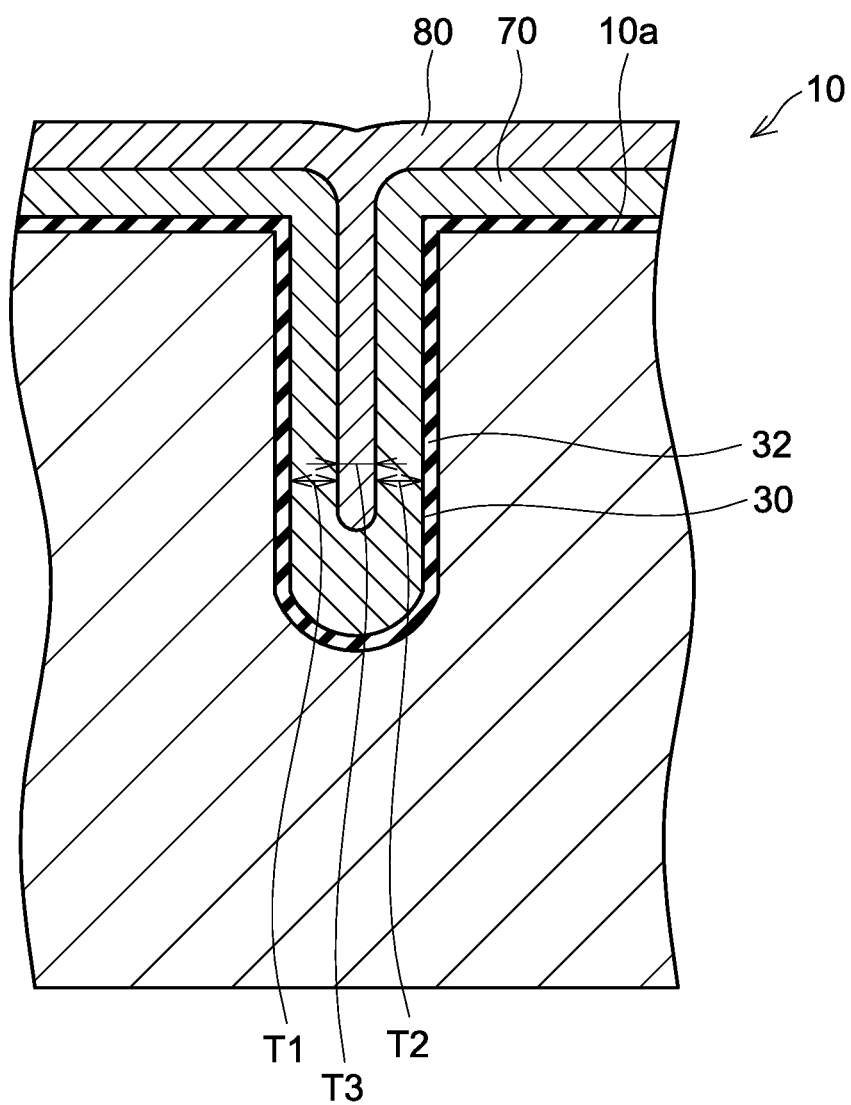
FIG. 5 is a cross sectional view (4) schematically showing the semiconductor device manufacturing method of the embodiment.

Next, as shown in FIG. 5, a second layer 80 constituted of polysilicon not containing phosphorus is deposited on a front surface of the first layer 70 in the trench 30 and on a front surface of the first layer 70 on the front surface 10a side of the semiconductor substrate 10. In the trench 30, the second layer 80 grows from the side surfaces 70a, 70b of the first layer 70 and from a bottom surface of the first layer 70. Here, the second layer 80 is formed so that the clearance 70c is filled completely with the second layer 80. The second layer 80 is formed by CVD. As shown in FIG. 5, a total of widthwise thicknesses T1, T2 of the first layer 70 located on both sides of the second layer 80 is larger than a widthwise thickness T3 of the second layer.

Figure 6:
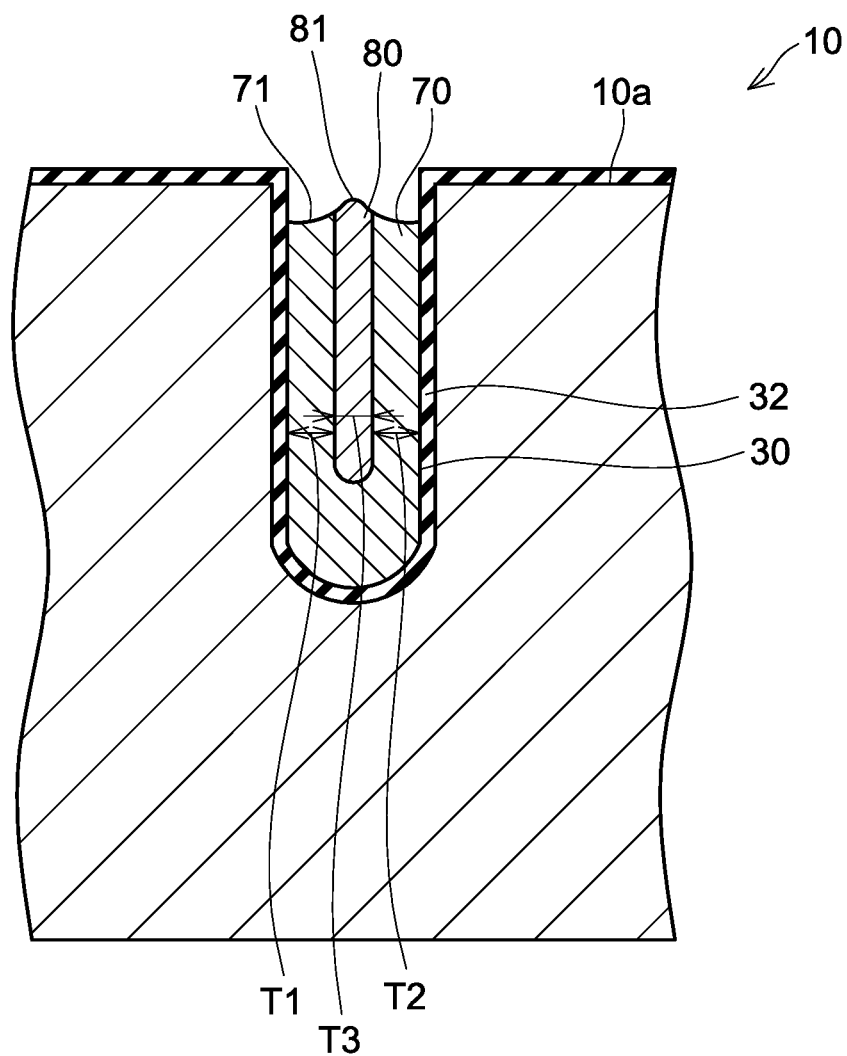
FIG. 6 is a cross sectional view (5) schematically showing the semiconductor device manufacturing method of the embodiment.

Next, as shown in FIG. 6, the first layer 70 and the second layer 80 in the trench 30 are etched. Here, the first layer 70 and the second layer 80 are etched from their front surfaces (upper side), Due to this, the first layer 70 and the second layer 80 formed on the front surface 10a of the semiconductor substrate 10 are removed. Further, parts (upper portions) of the first layer 70 and the second layer 80 in the trench 30 are removed. The etching is CDE (Chemical Dry Etching).

As mentioned above, the first layer 70 is constituted of polysilicon containing phosphorus, and the second layer 80 is constituted of polysilicon not containing phosphorus. Polysilicon not containing phosphorus has a higher etching resistance compared to polysilicon containing phosphorus. Due to this, since an etching rate of the second layer 80 is slower than that of the first layer 70, a front surface 81 of the second layer 80 is positioned at a shallower position (that is, closer to the front surface 10a of the semiconductor substrate 10) than a front surface 71 of the first layer 70 by the etching. That is, the front surface 81 projects upward than the front surface 71. Further, entireties of the front surface 71 of the first layer 70 and the front surface 81 of the second layer 80 come to be located lower (at deeper positions) than the front surface 10a of the semiconductor substrate 10 by the etching. The etching is performed so that the front surface 71 of the first layer 70 at a portion in contact with the gate insulating film 32 is located at a depth within 400 nm from the front surface 10a of the semiconductor substrate 10.

Figure 7:
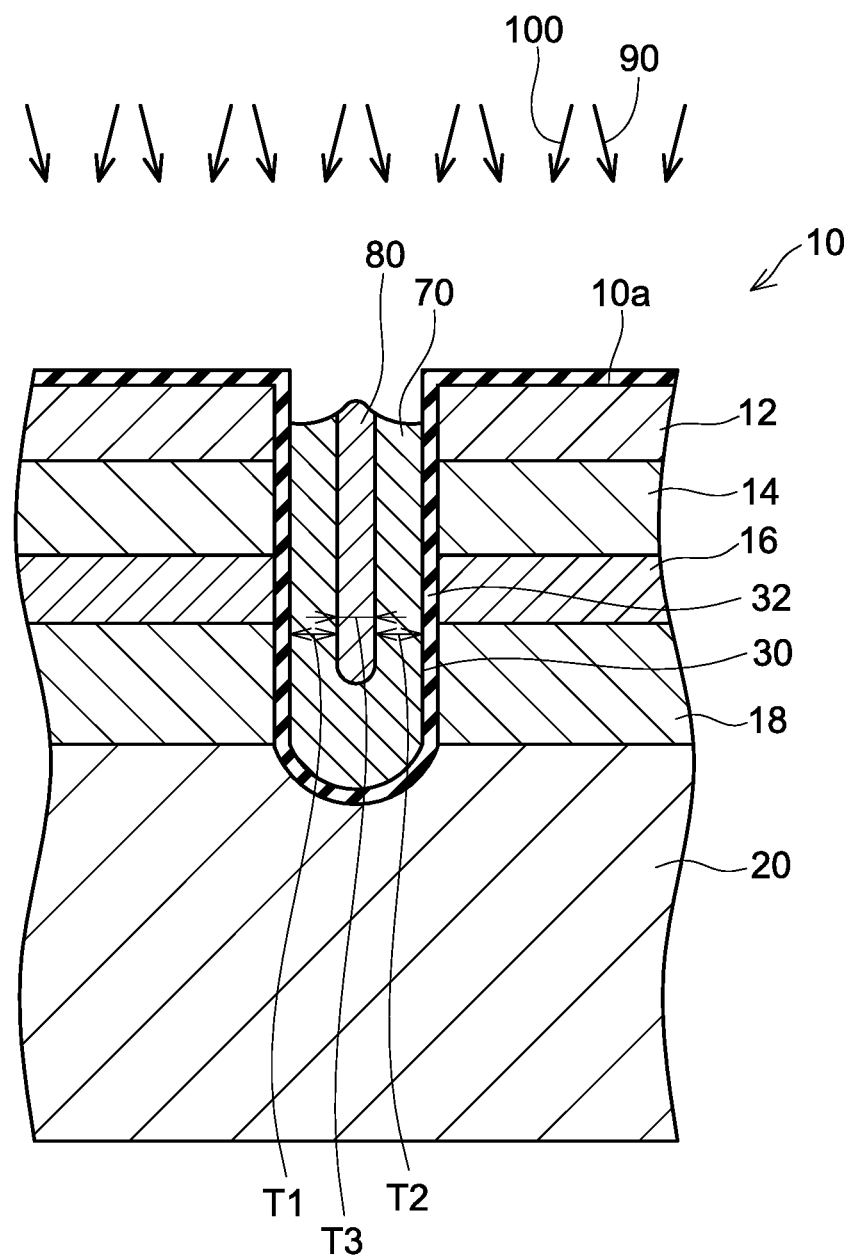
FIG. 7 is a cross sectional view (6) schematically showing the semiconductor device manufacturing method of the embodiment.

Next, as shown in FIG. 7, ion implantations are performed on the semiconductor substrate 10 from the front surface 10a side of the semiconductor substrate 10, and the emitter region 12, the top body region 14, the hairier region 16, and the bottom body region 18 are thereby formed. Further, the semiconductor substrate 10 at a portion where ions were not implanted configures the drift region 20. In this step, firstly, p-type impurities (phosphorus) are ion implanted to form the bottom. body region 18. Then, n-type impurities (boron) are ion implanted to form the barrier region 16. Next, p-type impurities are ion implanted to form the top body region 14. Then, n-type impurities are ion implanted to form the emitter region 12.

In this step, as shown by arrows 90, 100 of FIG. 7, the ion implantations are performed by providing tilt angles (for example, 7°). Further, as shown by the arrows 90, 100 of FIG. 7, each ion implantation is performed in two occasions from different directions. Due to this, the respective regions 12 to 18 can uniformly be formed on both sides of the trench 30.

Figure 8:
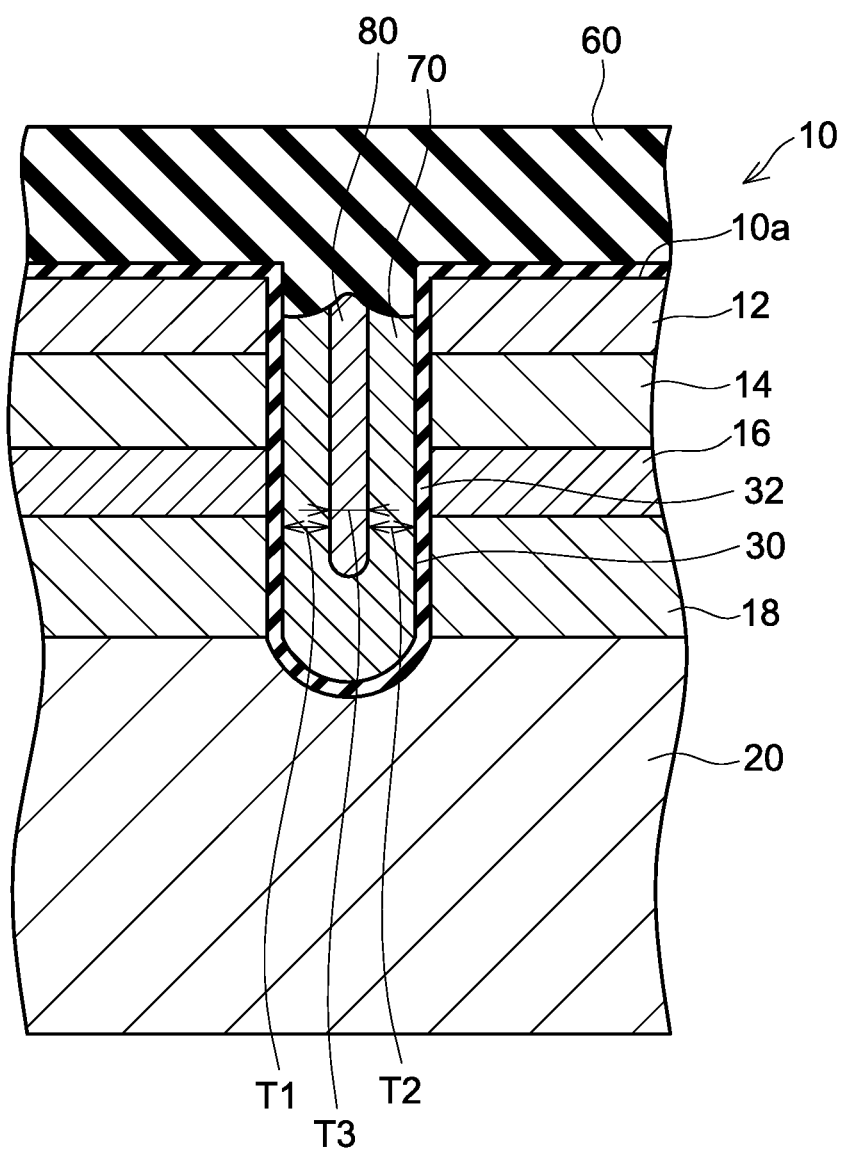
FIG. 8 is a cross sectional view (7) schematically showing the semiconductor device manufacturing method of the embodiment.

Then, as shown in FIG. 8, the interlayer insulating film 60 is formed on the front surface 10a of the semiconductor substrate 10. In the present embodiment, the interlayer insulating film 60 is formed by depositing BPSG (Boron Phosphorus Silicon Glass) by CVD.

Figure 9:
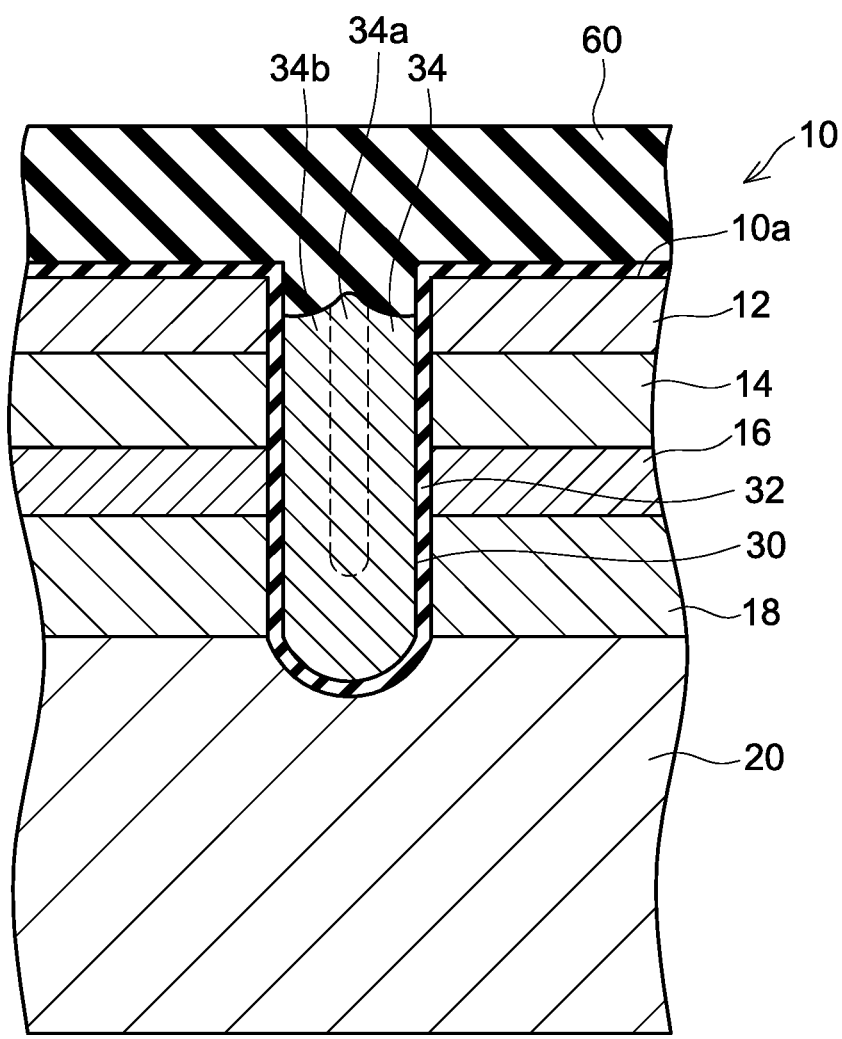
FIG. 9 is a cross sectional view (8) schematically showing the semiconductor device manufacturing method of the embodiment.

Then, the semiconductor substrate 10 is subjected to heat treatment. Due to this, phosphorus in the first layer 70 diffuses into the second layer 80. Due to this, phosphorus densities in the first layer 70 and the second layer 80 are made even, and the phosphorus densities of these layers become substantially equalized. As shown in FIG. 9, the first layer 70 and the second layer 80 in the trench 30 configure the gate electrode 34. The second portion 34b is formed based on the first layer 70, and the first portion 34a is formed based on the second layer 80. Further, a front surface of the interlayer insulating film 60 is subjected to reflow by the heat treatment, and at the same time, the respective regions 12 to 18 that had been formed by the ion implantations are activated.

Thereafter, the interlayer insulating film 60 and the gate insulating film 32 at a portion where the front surface electrode 40 (see FIG. 1) is to be connected are removed by etching. Then, the front surface electrode 40 is formed over an entirety of the front surface 10a of the semiconductor substrate 10 (see FIG. 1). The front surface electrode 40 may, for example, be formed by sputtering. After this, the collector region 22 is formed on the rear surface of the semiconductor substrate 10. The collector region 22 is formed by performing laser anneal after having ion implanted p-type impurities (phosphorus) to the rear surface of the semiconductor substrate 10. Then, the rear surface electrode 50 is formed over an entirety of the rear surface of the semiconductor substrate 10. The rear surface electrode 50 may, for example, be formed by sputtering.

The semiconductor device 2 of FIG. 1 is completed by performing the respective steps as above.

Figure 10:
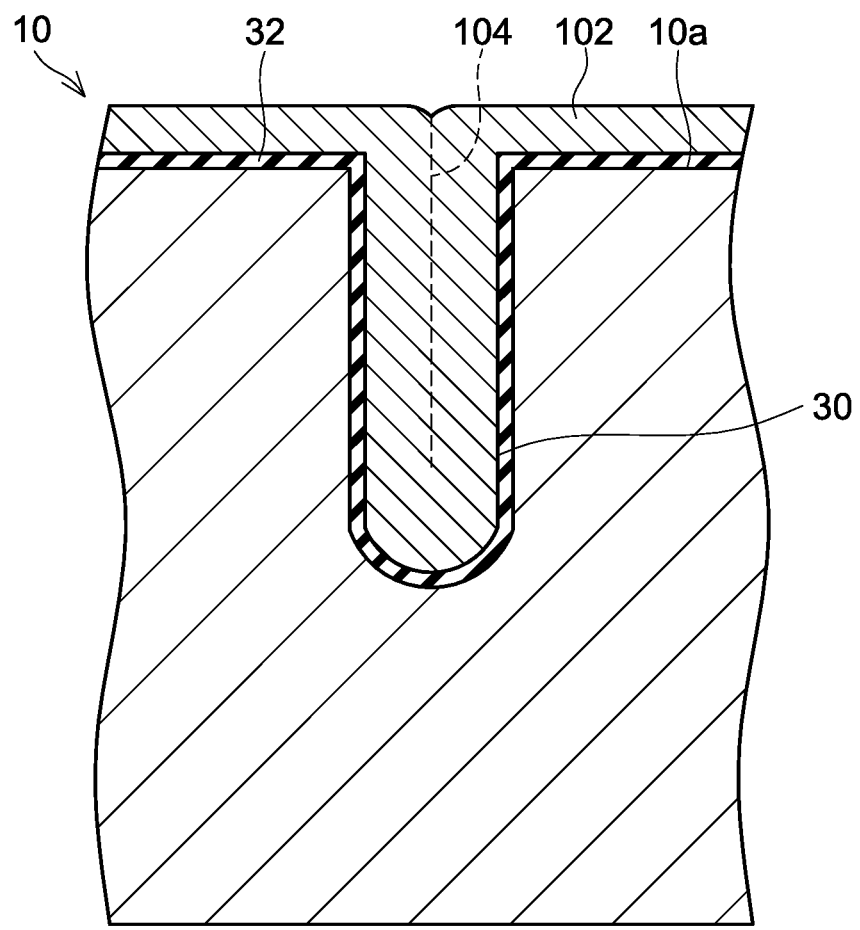
FIG. 10 is a cross sectional view (1) schematically showing a conventional semiconductor device manufacturing method.
Figure 11:
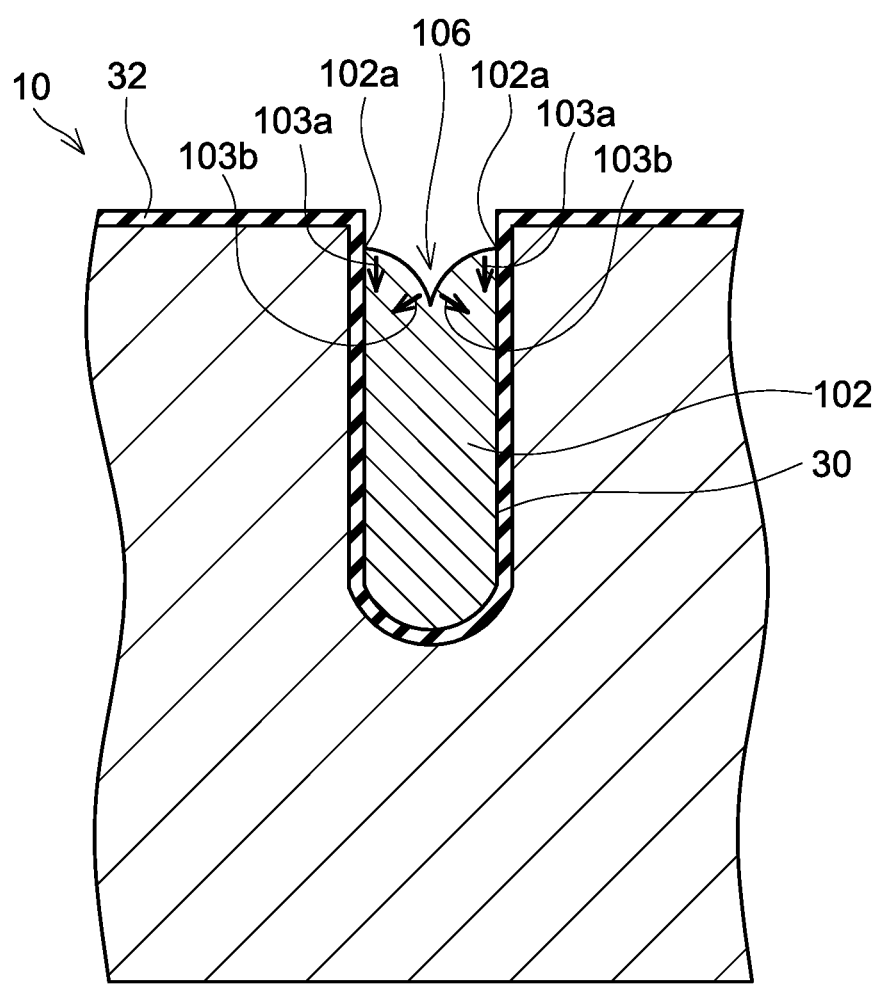
FIG. 11 is a cross sectional view (2) schematically showing the conventional semiconductor device manufacturing method.

Next, for a comparison to the manufacturing method of the present embodiment, a conventional method of manufacturing an IGBT will be described. In the conventional manufacturing method, after having formed the gate insulating film 32 as shown in FIG. 3, an electrode layer 102 is formed in the trench 30 as shown in FIG. 10. Here, the trench 30 is completely filled with the electrode layer 102. At this occasion, as shown in FIG. 10 by a broken line, a portion 104 having a weak bonding force is formed along a center of the trench 30. Then, as shown in FIG. 11, the electrode layer 102 is etched from its upper side. In doing so, since the etching progresses faster at the portion 104 having the weak bonding force, thus as shown in FIG 11, a recess 106 is formed on a front surface of the electrode layer 102. When such a recess 106 is formed on the front surface of the electrode layer 102, the etching progresses on the front surface of the electrode layer 102 along a depth direction as shown by an arrow 103a as well as laterally as shown by an arrow 103b in FIG. 11. When the electrode layer 102 is etched as above, an etching rate for a front surface 102a of the electrode layer 102 at a portion in contact with the gate insulating film 32 comes to be influenced not only by a depthwise etching rate shown by the arrow 103a but also by a lateral etching rate shown by the arrow 103b. Due to this, the etching rate for the front surface 102a is not stabilized, and a post-etch positional error of the front surface 102a becomes larger. Next, ion implantations are performed on the semiconductor substrate 10 from the front surface 10a side of the semiconductor substrate 10 to form the emitter region 12, the top body region 14, the barrier region 16, and the bottom body region 18. An ion implantation depth in a vicinity of the trench 30 changes according to the position of the front surface 102a. As above, since the positional error of the front surface 102a is large, an ion implantation depth error is also large in the vicinity of the trench 30. Due to this, according to the conventional method, the impurity densities in the vicinities of the trenches vary, and there was a problem that a variation in performance (that is, thresholds) becomes large among the IGBTs to be manufactured.

Contrary to this, in the manufacturing method of the present embodiment, the second layer 80 constituted of polysilicon not containing phosphorus has a higher etching resistance than the first layer 70 constituted of polysilicon containing phosphorus. Due to this, the front surface of the second layer 80 comes to have a shape projecting upward than the front surface of the first layer 70 by the etching. With such a shape, the etching rate of the front surface 71 of the first layer 70 at the portion in contact with the gate insulating film 32 is not influenced by the lateral etching rate as shown by the arrow 103b in FIG. 11. Thus, the etching rate for the front surface 71 can be controlled more accurately, so the post-etch position of the front surface 71 can be controlled accurately. Thus, the ion implantation depths at the time of the ion implantations can be controlled accurately. That is, an occurrence of a variation in shapes of the respective regions 12 to 18 to be formed after the etching can also be prevented. Thus, in a case of forming a diffusion layer by performing an ion implantation from the front surface 10a side of the semiconductor substrate 10 after the etching, the variation in the impurity densities in the vicinity of the trenches can be suppressed, and the variation in performance (that is, thresholds) among the semiconductor devices to be manufactured can be suppressed.

Further, in the manufacturing method of the present embodiment, as shown in FIGS. 5 to 8, the total of the widthwise thicknesses T1, T2 of the first layer 70 located on both sides of the second layer 80 in the width direction of the trench 30 is larger than the widthwise thickness T3 of the second layer. Due to this, phosphorus in the first layer 70 can sufficiently diffuse into the second layer 80 in the heat treatment step (see FIG. 9) that is to take place thereafter. Due to this, the gate electrode 34 having a suitable conductivity can be formed based on the first layer 70 and the second layer 80.

Further, in the manufacturing method of the present embodiment, the etching is performed so that the front surface of the first layer 70 at the portion in contact with the gate insulating film 32 is located at the depth within 400 nm from the front surface 10a of the semiconductor substrate 10 (see FIG, 6). If the front surface of the first layer 70 at the portion in contact with the gate insulating film 32 is located at a position deeper than 400 nm from the front surface 10a of the semiconductor substrate 10, ion implantation depths become locally deep in the vicinity of the trench 30 upon the ion implantations. Due to this, the respective regions 12 to 18 in the vicinity of the trench 30 warp largely in a rear surface direction of the semiconductor substrate 10, deteriorating the performance of the semiconductor device 2. In this regard, according to the manufacturing method of the present embodiment, the warping in the respective regions 12 to 18 in the vicinity of the trench 30 can be made smaller even when the respective regions 12 to 18 are formed after the etching, as compared to the case where the front surface of the first layer 70 at the portion in contact with the gate insulating film 32 is located at the position deeper than 400 nm from the front surface 10a of the semiconductor substrate 10. A semiconductor device 2 having a satisfactory performance can be manufactured.

Further, the semiconductor device 2 manufactured by the manufacturing method of the present embodiment comprises the barrier region 16 provided between the top body region 14 and the bottom body region 18. As aforementioned, according to the manufacturing method of the present embodiment, the front surface of the second layer 80 comes to have the shape projecting upward than the front surface of the first layer 70 at the time of etching. Due to this, the ion implantation depths for steps thereafter can also be controlled accurately. Due to this, an occurrence of an event in which the top body region 14 and the bottom body region 18 warp toward the rear surface direction of the semiconductor substrate 10 in the vicinity of the trench 30, as a result of which the barrier region 16 to be formed between the top body region 14 and the bottom body region 18 disappears can also be suppressed.

Specific examples of the art disclosed herein have been described in detail, however, these are mere exemplary indications and thus do not limit the scope of the claims. The art described in the claims include modifications and variations of the specific examples presented above. For example, the following modifications may be implemented.

(Modification 1) In the above embodiment, the first layer 70 is constituted of polysilicon containing phosphorus, and the second layer 80 is constituted of polysilicon not containing phosphorus. Not being limited hereto, both of the first layer 70 and the second layer 80 may be constituted of polysilicon containing phosphorus. In this case, a phosphorus density in the first layer 70 simply needs to be higher than a phosphorus density in the second layer 80.

(Modification 2) In the above embodiment, the semiconductor device 2 is an IGBT however, the semiconductor device 2 may be any arbitrary semiconductor device so long as it is a trench gate type semiconductor device. For example the semiconductor device 2 may be a power MOS.

(Modification 3) In the above embodiment, the semiconductor substrate 10 is constituted of Si. Not being limited hereto, the semiconductor substrate 10 may be constituted of SiC.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:
1. A semiconductor device comprising:
a semiconductor substrate;
a trench provided in a front surface of the semiconductor substrate;
a gate insulating film covering an inner surface of the trench; and
a gate electrode provided on an inner side of the gate insulating film, the gate electrode including a first layer and a second layer,
wherein
the first layer includes an outer portion of a front surface of the gate electrode,
the second layer includes a middle portion of the front surface,
the front surface of the gate electrode is provided at a position deeper than the front surface of the semiconductor substrate, and the middle portion of the front surface, which is located at a center in a width direction of the trench, is provided at a position shallower than the outer portion of the front surface, which is in contact with the gate insulating film,
the middle portion and the outer portion form a single, continuous surface, of the front surface, and
the outer portion is provided at a depth within 400 nm from the front surface of the semiconductor substrate.
2. The semiconductor device as in claim 1, further comprising:
a front surface semiconductor region of a first conductivity type exposed on the front surface of the semiconductor substrate;
a top body region of a second conductivity type provided at a position deeper than the front surface semiconductor region;
a barrier region of the first conductivity type provided at a position deeper than the top body region; and
a drift region of the first conductivity type having a lower first conductivity type impurity density than the barrier region, and provided at a position deeper than the barrier region,
wherein the trench penetrates the front surface semiconductor region, the top body region, and the barrier region, and
a lower end of the trench projects into the drift region.
3. The semiconductor device as in claim 2, further comprising:
a bottom body region provided at a position deeper than the barrier region and shallower than the drift region,
wherein the trench further penetrates the bottom body region.
4. The semiconductor device as in claim 1, wherein the first layer is provided with a phosphorus density higher than that of the second layer prior to a heat treatment of the gate electrode, such that the middle portion is more resistant to etching than the outer portion during formation of the front surface prior to the heat treatment of the gate electrode.
5. The semiconductor device as in claim 1, wherein the middle portion is positioned at a depth between the depth of the outer portion and the front surface of the semiconductor substrate.

* * * * *